(12) United States Patent
Rose et al.

(10) Patent No.: US 6,273,991 B1
(45) Date of Patent: Aug. 14, 2001

(54) APPARATUS FOR PLASMA ION TRIMMING OF FREQUENCY DEVICES

(75) Inventors: Dwane L. Rose, Scottsdale; Mark M. Howse, Glendale; Ronald K. Wixon, Phoenix, all of AZ (US)

(73) Assignee: Saunders & Associates, Inc., Scottsdale, AZ (US)

( * ) Notice: Subject to any disclaimer, the term of this patent is extended or adjusted under 35 U.S.C. 154(b) by 0 days.

(21) Appl. No.: 09/362,268

(22) Filed: Jul. 28, 1999

(51) Int. Cl.[7] .......................................... C23F 1/02
(52) U.S. Cl. ............................. 156/345; 118/719
(58) Field of Search .............. 118/723 E, 723 ER, 118/723 I, 723 IR, 723 AN, 723 FI, 719; 156/345; 204/298.25, 298.35, 298.04, 298.36

(56) References Cited

U.S. PATENT DOCUMENTS

| | | | |
|---|---|---|---|
| 4,278,492 | * 7/1981 | Cross et al. | 156/627 |
| 4,395,849 | * 8/1983 | Kasai et al. | 51/319 |
| 5,013,416 | * 5/1991 | Murayama et al. | 204/192.1 |
| 5,407,525 | * 4/1995 | Michel et al. | 156/627 |
| 5,630,949 | * 5/1997 | Lakin | 216/61 |
| 5,662,782 | * 9/1997 | Gomi et al. | 204/192.34 |
| 5,958,134 | * 9/1999 | Yasar et al. | 118/50 |
| 6,143,040 | * 11/2000 | Tometsuka et al. | 29/25.01 |

\* cited by examiner

*Primary Examiner*—Gregory Mills
*Assistant Examiner*—Luz Alejandro
(74) *Attorney, Agent, or Firm*—Weiss & Moy, P.C.; Jeffrey D. Moy; Harry M. Weiss

(57) ABSTRACT

A system for simultaneous frequency trimming of a plurality frequency devices such as oscillators, crystals and surface acoustic wave filters and resonators by removing intrinsic or previously deposited material through plasma ion bombardment is comprised of a plasma ion chamber, a magazine rack, a vacuum evacuator, a control console, a plasma power supply and a frequency evaluator. The system employs a shutter assembly and shutter control mechanism to individually regulate plasma ion bombardment of a plurality of frequency devices.

20 Claims, 11 Drawing Sheets

APPARATUS FOR PLASMA ION TRIMMING OF FREQUENCY DEVICES

BACKGROUND OF THE INVENTION

1. Field of the Invention

This invention relates generally to adjustment or trimming systems for frequency devices such as oscillators, crystals and surface acoustic wave filters and resonators. Specifically, this invention is a system for trimming devices to a pre-determined frequency by removing intrinsic or previously deposited materials through a controlled plasma ion bombardment process.

2. Description of the Related Art

In the prior art, trimming of frequency devices such as oscillators, crystals and surface acoustic wave filters and resonators depended on several techniques. For those devices where material such as precious and semi-precious metal is deposited or sputtered on to the frequency device, the technique is to carefully control the deposition of material on the frequency device such that the target frequency is achieved without the necessity of the subsequent removal of the deposited material. A disadvantage to this technique is the requirement to constantly attend to the deposition apparatus to insure that an adequate supply of deposition material was available within the apparatus during the deposition process. Another disadvantage to this technique is that the deposition of material take place on a part by part basis, which is a time consuming, and thus costly process. Also, extreme care must be exercised not to over deposit the material on the frequency device.

A second technique relied on batch processing of the material deposition on several devices simultaneously. The batch processing aspect of this technique would require the over approximation of the target frequency by depositing perhaps slightly more material than required. Following the deposition step, each part would be individually trimmed to the target frequency by a plasma ion process or other suitable process to remove a small portion of the deposited material. For those frequency devices not undergoing deposition of material, the trimming of intrinsic material, e.g. material comprising the substrate, such as silicon dioxide, also requires a part by part process under the prior art. Again, the time consuming nature of trimming each part individually, whether trimming of deposited material or intrinsic material, is a disadvantage to this procedure.

Therefore, a solution to the costly and unproductive limitations imposed by the prior art was needed for trimming frequency devices to the target frequency.

BRIEF SUMMRRY OF THE INVENTION

It is an object of the present invention to provide a complete system for the simultaneous frequency trimming of a plurality of frequency devices such as oscillators, crystals and surface acoustic wave filters and resonators.

It is another object of the present invention to provide a plasma ion chamber for simultaneous frequency trimming of a plurality of frequency devices such as oscillators, crystals and surface acoustic wave filters and resonators.

It is another object of the present invention to provide a ionization station for the simultaneous frequency trimming of a plurality of frequency devices such as oscillators, crystals and surface acoustic wave filters and resonators.

It is still another object of the present invention to control the trimming of a plurality of frequency devices by permitting or restricting the effects of plasma ion bombardment on a device by device basis. Trimming control is provided by a shutter assembly comprised of a plurality of individual shutters, wherein each of the individual shutters corresponds to a frequency device. Plasma ion bombardment of a frequency device is permitted by selecting an open position for an individual shutter and plasma ion bombardment of a frequency device is restricted by selecting the closed position of an individual shutter corresponding to a particular frequency device.

It is still another object of the present invention to determine the frequency and acquire other data from the frequency device without having to remove the frequency device from the system or the plasma ion chamber.

It is still another object of the present invention to determine the frequency and acquire other data from the frequency device while plasma ion bombardment is occurring to the frequency device.

In accordance with one embodiment of the present invention, a system for trimming frequency devices, comprises a plasma ion chamber for ion bombardment of the frequency devices; a magazine rack coupled to the plasma ion chamber for storing a plurality of the frequency devices; a vacuum evacuator coupled to the plasma ion chamber for creating a vacuum in the plasma ion chamber; a plasma power supply coupled to the plasma ion chamber for providing power to an ion gun; a frequency evaluator coupled to the plasma ion chamber for determining the frequency of the frequency devices; and a control console coupled to the plasma ion chamber, the magazine rack, the vacuum evacuator, the plasma power supply and the frequency evaluator for controlling the operation of the system.

In accordance with another embodiment of the present invention, a plasma ion chamber for trimming frequency devices comprises a bell jar for providing a hermetically sealable chamber for conducting plasma ion bombardment; a bell jar hinge assembly coupled to the bell jar for opening and closing a surface of the bell jar; an insertion/extraction port coupled to the bell jar for inserting and removing the frequency devices from the plasma ion chamber; an ion gun coupled to the bell jar for conducting plasma ionization within the plasma ion chamber; a baseplate located internal to the bell jar for mounting a plurality of mechanical components; a drive assembly coupled to the baseplate for controlling the movement of a boat containing the frequency devices; an ionization station coupled to the baseplate for regulating the plasma ion bombardment of the frequency devices; and a shutter mechanism coupled to the baseplate for interfacing with the ionization station.

In still another embodiment of the present invention, an ionization station for trimming frequency devices comprises a contact mechanism coupled to a baseplate; a shutter assembly coupled to the contact mechanism for regulating plasma ion bombardment of the frequency devices; and a top etching shield coupled to the shutter assembly for protecting the contact mechanism from the plasma ion bombardment; wherein the contact mechanism comprises a probe assembly for acquiring data from the frequency devices; and a linear slide coupled to the probe assembly for controlling vertical movement of the probe assembly.

The foregoing and other objects, features, and advantages of the invention will be apparent from the following, more particular, description of the preferred embodiments of the invention, as illustrated in the accompanying drawings.

DETAILED DESCRIPTION OF THE INVENTION

Figure 1:
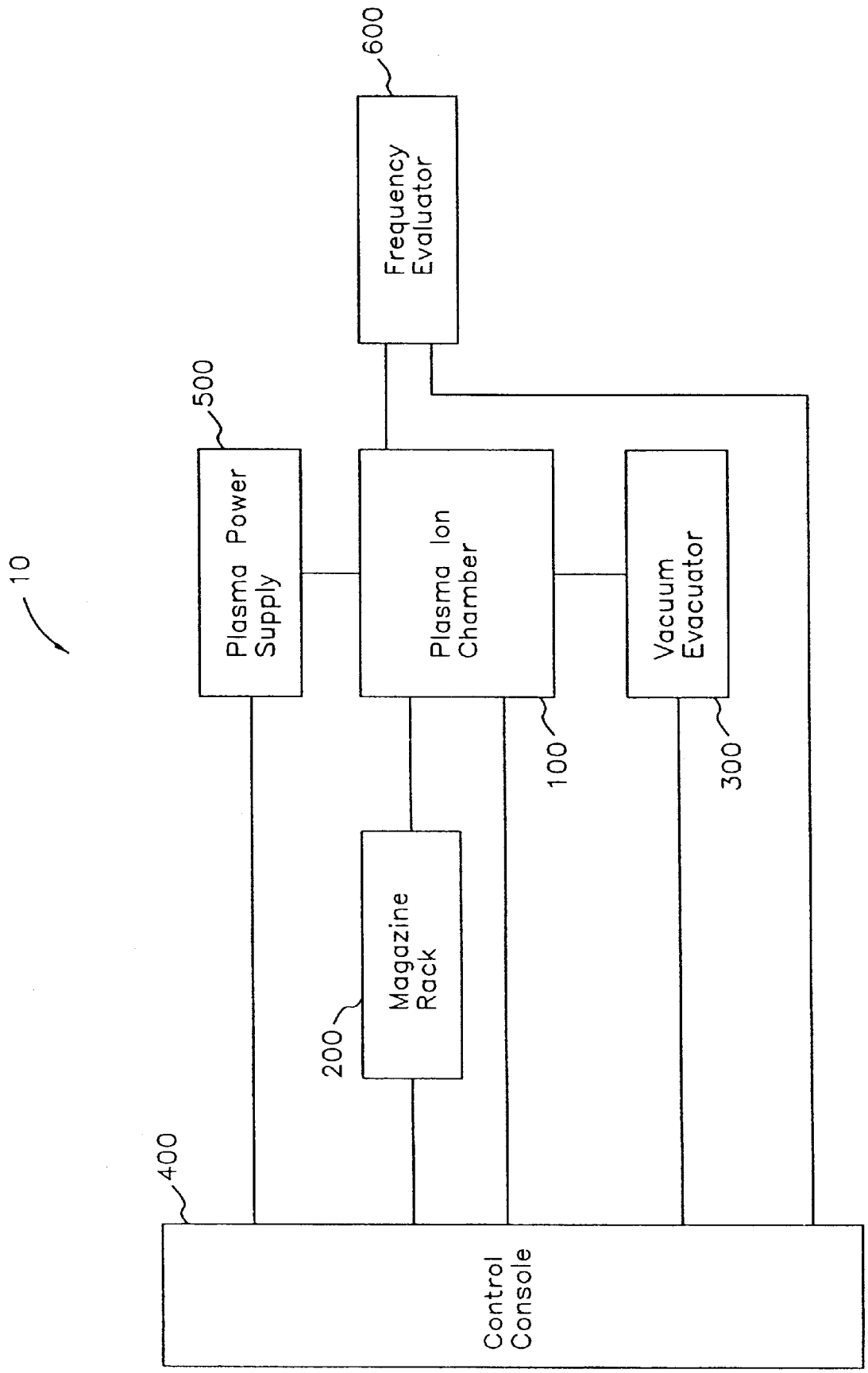
FIG. 1 is a block diagram of the present invention comprising a plasma ion chamber, a magazine rack, a vacuum evacuator, a plasma power supply, a control console, and a frequency evaluator.

Referring to FIG. 1, a block diagram of the plasma ion trimming system ("system") 10 for frequency devices is illustrated. The system 10 is comprised of a plasma ion chamber 100, a magazine rack 200, a vacuum evacuator 300, a control console 400, a plasma power supply 500, and a frequency evaluator 600. The plasma ion chamber 100, the magazine rack 200 and the vacuum evacuator 300 are described in detail below.

The control console 400 is typically a personal or minicomputer with customized I/O interfaces to the plasma ion chamber 100, the magazine rack 200, the vacuum evacuator 300, the plasma power supply 500 and the frequency evaluator 600. The control console 400 executes custom software which oversees the operation of the system 10. The system 10 is operated from the control console.

The plasma power supply 500 is typically an original equipment manufactured (OEM) device which supplies the appropriate power requirements of the plasma ion gun. The plasma ion gun, which is a component of the plasma ion chamber 100, is the device which removes the intrinsic or previously deposited material from frequency devices via ion bombardment. The control console 400 is coupled to the plasma power supply 500 for controlling the power available to the plasma ion gun.

The frequency evaluator 600 is also an OEM device which is coupled to the plasma ion chamber 100 and to the control console 400. The frequency evaluator 600 receives data from the frequency devices undergoing ion bombardment for the removal of intrinsic or previously deposited material. From the data received, the actual frequency of the frequency device, is determined while the frequency device is within the plasma ion chamber 100.

That is, one aspect of the system 10, is that the frequency devices can be evaluated on a real time basis while undergoing trimming and located within the system 10. An improvement over the prior art, the frequency devices need not be removed from the system 10 for frequency evaluation. Even when plasma ion bombardment is taking place, the control console 400 and the frequency evaluator 600 are receiving data from the frequency devices. The data received from probing the devices may be output to the central console 400 and to the frequency evaluator 600.

Figure 2:
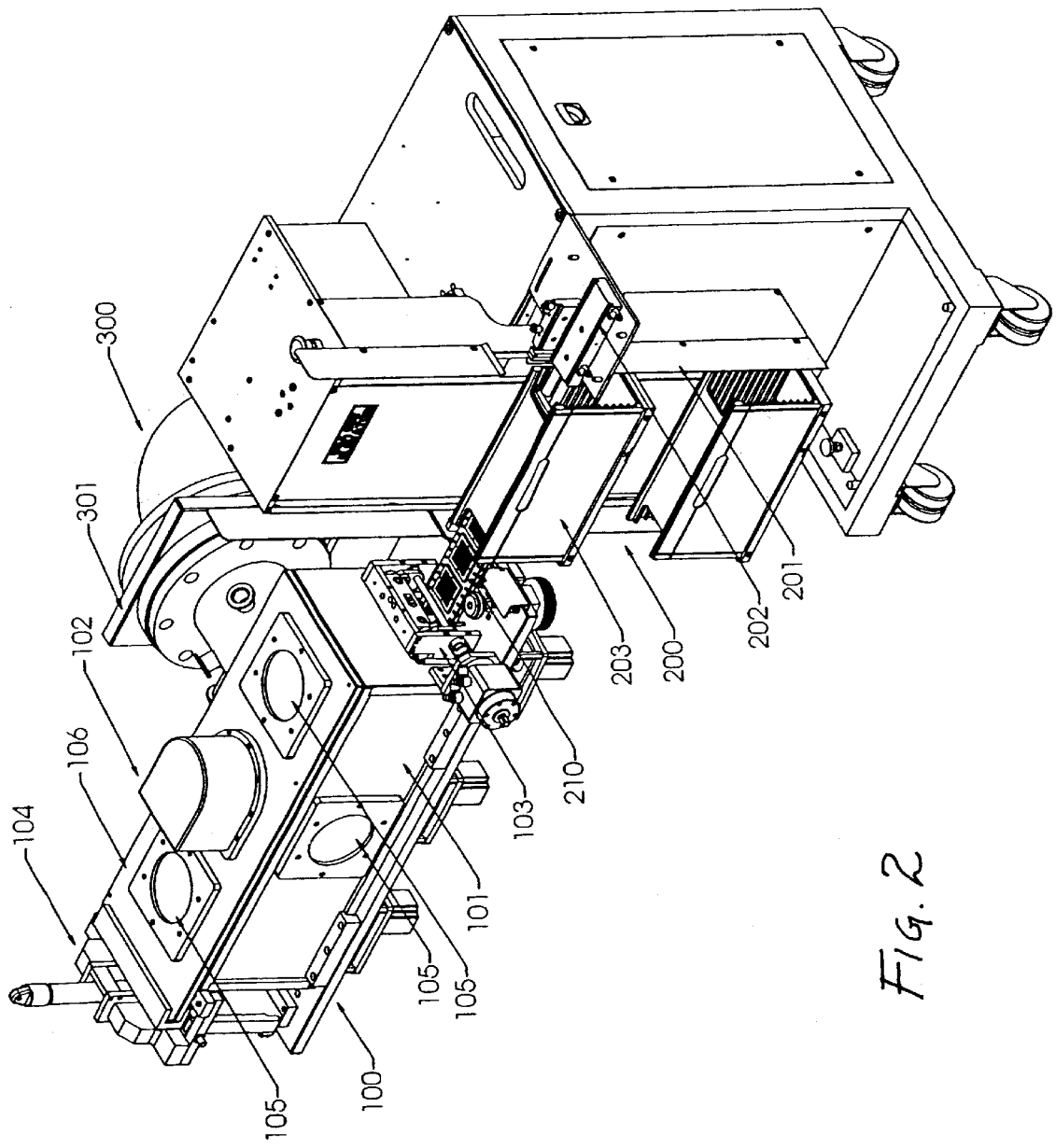
FIG. 2 is a perspective view illustrating the plasma ion chamber including the plasma ion gun, the vacuum evacuator and the magazine rack.

Referring to FIG. 2, wherein like numerals represent like elements from the preceding figure, a perspective view of several components of the present invention are shown including the plasma ion chamber 100, the magazine rack 200, and portions of the vacuum evacuator 300. The control console 400, plasma power supply 500, and frequency evaluator 600 are not shown, but would reside in a cabinet, work station or other type of suitable station, adjacent to those components which are shown.

Ion bombardment, and thus frequency trimming which is the ultimate objective of the system 10, occurs within the plasma ion chamber 100. There are a variety of components, in terms of differing performance and capacity, such as the magazine rack 200, the vacuum evacuator 300, the control console 400, the plasma power supply 500 and the frequency evaluator 600, which may interface with the plasma ion chamber 100.

The external portions of the plasma ion chamber 100 are shown in FIG. 2. These include the bell jar 101 which is the vacuum tight casing for the chamber, the ion gun 102 (only the cover for the ion gun is visible in FIG. 2), the insertion/extraction port 103 and the bell jar hinge assembly 104. The internal components of the plasma ion chamber 100 are discussed in detail below.

The bell jar 101 is typically a hermetically sealable metal case. On at least one surface of the bell jar 101 is a porthole 105 for viewing of the internal componentry of the plasma ion chamber 100. In the embodiment shown in FIG. 2, several portholes 105 are shown.

The ion gun 102 is mounted on the top surface 106 of the bell jar 101. The ion gun 102 projects down into the inside of the plasma ion chamber 100. Existing, but not shown, are the electrical connections between the ion gun 102 and the control console 400 and the plasma power supply 500 of FIG. 1. The ion gun 102 is typically OEM equipment.

In the preferred embodiment, the bell jar 101 is a rectangular box-like shape. That is, the two lateral sides, top 106 and bottom surfaces are rectangular and some what elongated as compared to the two end surfaces which tend to be more square-like, but not necessarily a perfect square. The bell jar 101 is shaped as such to accommodate the geometry of the boats 210, discussed below, which contain the frequency devices, i.e. the subjects of the frequency trimming process.

The insertion/extraction port 103 is coupled to one end surface of the bell jar 101. The function of the insertion/ extraction port 103 is to provide an opening in the bell jar 101 for the insertion and extraction of the boat 210 which contain the frequency devices. FIG. 2 illustrates a boat 210 shown being inserted into or extracted from the plasma ion chamber 100 via the insertion/extraction port 103. The insertion/extraction port 103 is also capable of sealing the opening in the bell jar 101 once the devices are inserted into the plasma ion chamber 100 so that a vacuum may be created.

The bell jar hinge assembly 104 is coupled to the opposite end of the bell jar 101 from the insertion/extraction port 103. The function of the bell jar hinge assembly 104 is to provide a mechanism for opening or separating the top surface 106 of the bell jar 101 from the lateral and end surfaces. The bell jar hinge assembly 104 is comprised of a damped, pivoting hinge. In the embodiment shown in FIG. 2, the bell jar hinge assembly 104 is manually operated. However, in other embodiments a motorized bell jar hinge assembly 104 may be implemented. In such an embodiment, the operation of the bell jar hinge assembly 104 maybe automated from the control console 400.

The top surface 106 of the bell jar 101 may be opened for servicing the internal components of the plasma ion chamber 100. When there is no vacuum within the plasma ion chamber, the top surface 106 of the bell jar 101 may be lifted by a handle attached to the top surface 106 (not shown) and the bell jar 101 may be opened by pivoting the top surface 106 via the bell jar hinge assembly 104 away from the remainder of the bell jar 101. The ion gun 102, which is attached to the top surface 106 of the bell jar 101, pivots accordingly when the top surface 106 is opened.

As part of the bell jar hinge assembly 104, a dampener holds the top surface 106 in an open position and dampens the return of the top surface 106 to the closed position. When in the closed position, an O-ring (not shown) serves to create a seal as between the top surface 106 and the remainder of the bell jar 101 so that a vacuum may be effected.

The magazine rack 200 is comprised of a two station magazine elevator 201 and boat pusher assembly 202. A magazine 203 is mounted at each station. One station is the active station, i.e. the station from which devices are fed into the plasma ion chamber from the magazine, shown as the upper station in FIG. 2. The other station is the standby station, i.e. the station from which are loaded and unloaded from the magazine elevator, shown as the lower station in FIG. 2. When trimming the frequency devices in the magazine 203 loaded on the active station is complete, the magazine elevator 201 toggles the active station to the standby station and the standby station to the active station. At the standby station, the magazine 203 containing the frequency trimmed devices is removed and a fresh magazine of devices requiring trimming is loaded. Thus, the magazine elevator 201 shuttles the loaded magazines 203 as between the two stations.

The vacuum evacuator 300 is coupled to the plasma ion chamber 100 for the purpose of creating a vacuum within the bell jar 101 prior to plasma ion bombardment. The vacuum evacuator is comprised of a gate valve 301, a vacuum pump (not shown) and appropriate hardware to couple the gate valve 301 and the vacuum pump to the plasma ion chamber 100. The operation of the vacuum evacuator of whether to create or release the vacuum within the bell jar 101 is effected by the control console 400.

Figure 3:
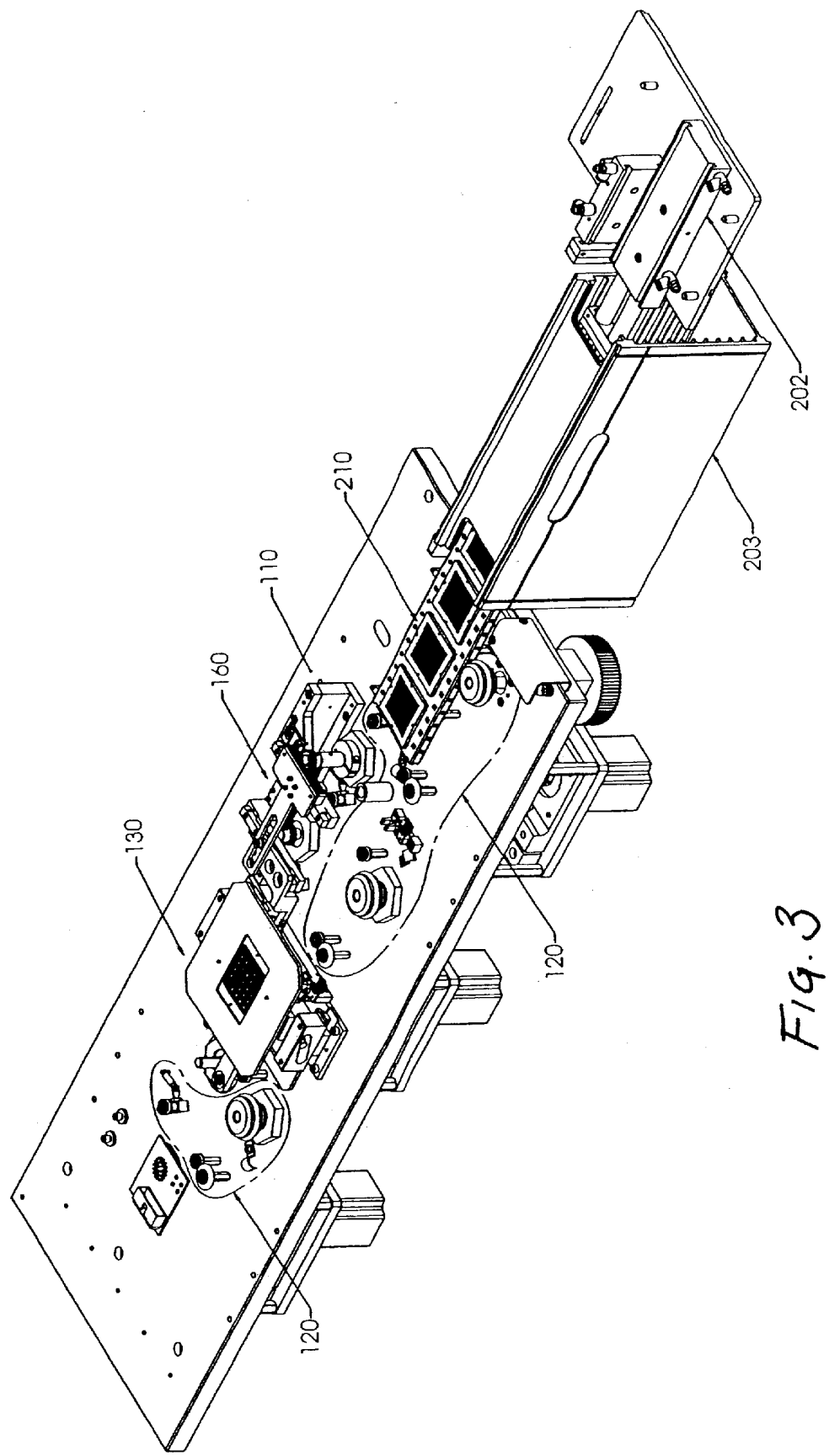
FIG. 3 is a perspective view of portions of the magazine rack and certain internal components of the plasma ion chamber.

Referring to FIG. 3, wherein like numerals represent like elements from the preceding figures, portions of the magazine rack 200 and certain mechanical components which are internal to the plasma ion chamber 100 are shown.

Figure 9:
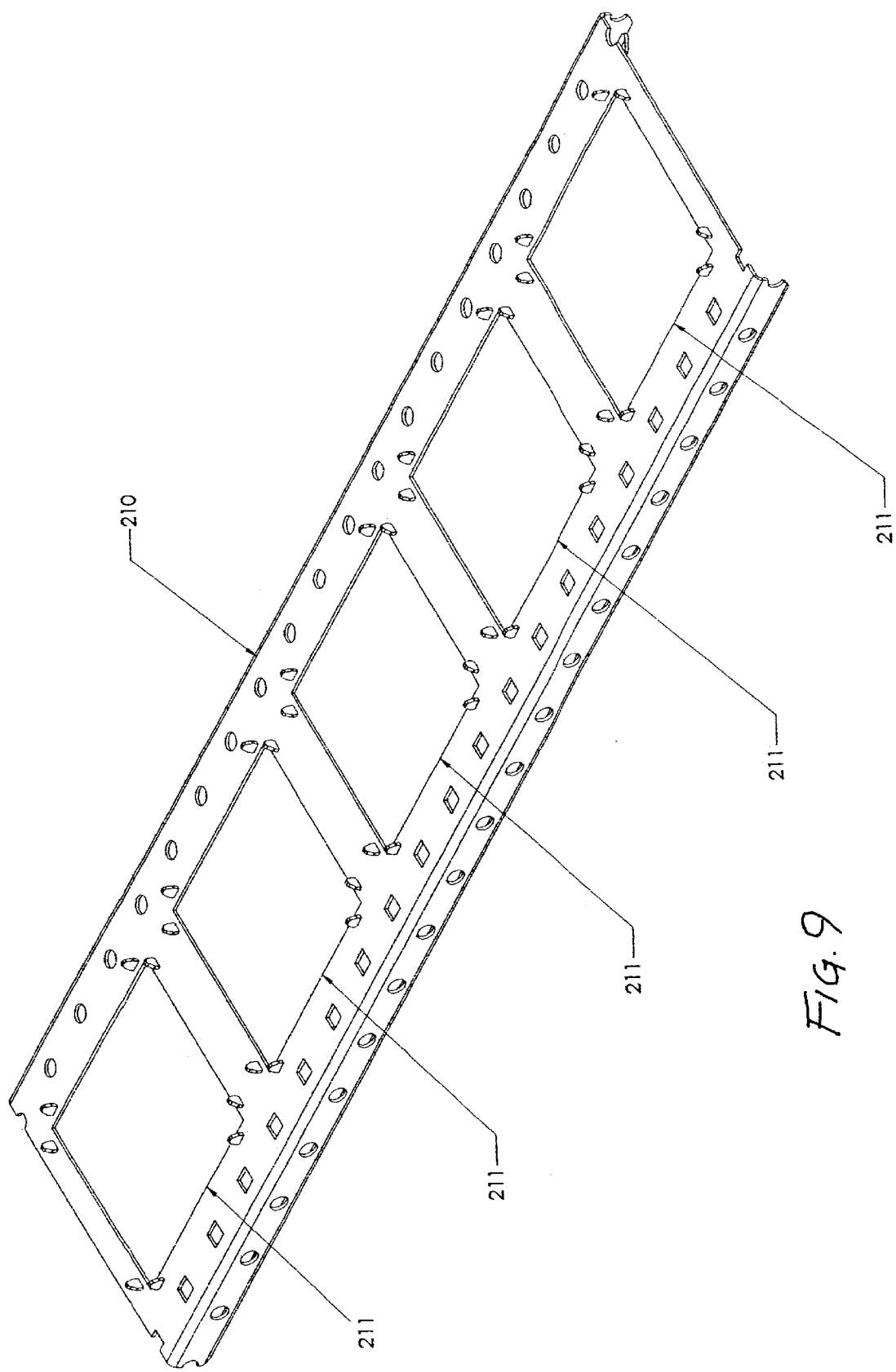
FIG. 9 is a top perspective view of an unpopulated boat. The illustrated boat is not populated with pallets or frequency devices. This figure illustrates the basic geometry of the boat and of the pallet apertures within the boat.
Figure 10:
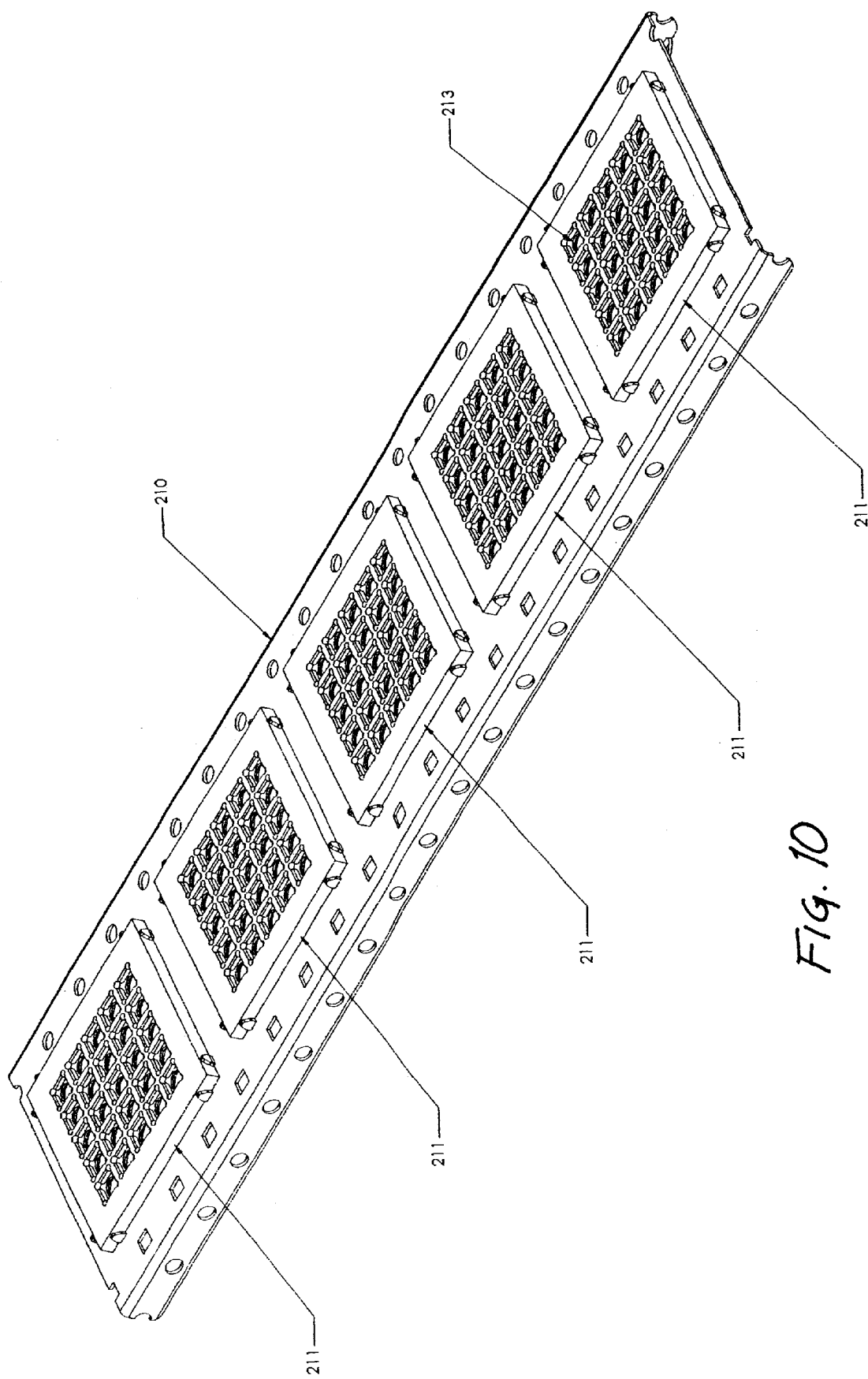
FIG. 10 is a top perspective view of boat populated with pallets. The pallets themselves are unpopulated, i.e. the frequency devices are absent. The device aperture matrix for each pallet is visible. The pallets are held in place on the boat by a series of tabs around the perimeter of the pallet aperture.

Each magazine 203 may contain a plurality of boats 210. In FIG. 3, only one boat 210 is shown, partially extended from the magazine 203. However, the magazine 203 has the capacity for numerous boats 210. A boat 210 is a rectangular shaped tray with a plurality of pallet apertures 211 as shown in FIG. 9. The pallet apertures 211 are typically arranged in a sequential or linear fashion. Each pallet aperture 211 is capable of accommodating a pallet 212 as shown in FIG. 10. The pallet 212 is positioned over the pallet aperture 211 and held in place by a plurality of tabs. Thus, the boat 210 is capable of accepting a pallet 212 for each of the pallet apertures. The illustrated boat 210 is shown with five pallets 212, however, boats 210 of different configurations are possible.

Each pallet 212 as shown in FIG. 10 is comprised of a metal plate with a plurality of device apertures 213. The device apertures 213 are typically arranged in matrix format, however, other formats, symmetrical or asymmetrical, including linear, are possible. In the preferred embodiment, a frequency device which requires frequency trimming is inserted into each of the device apertures 213.

Figure 11:
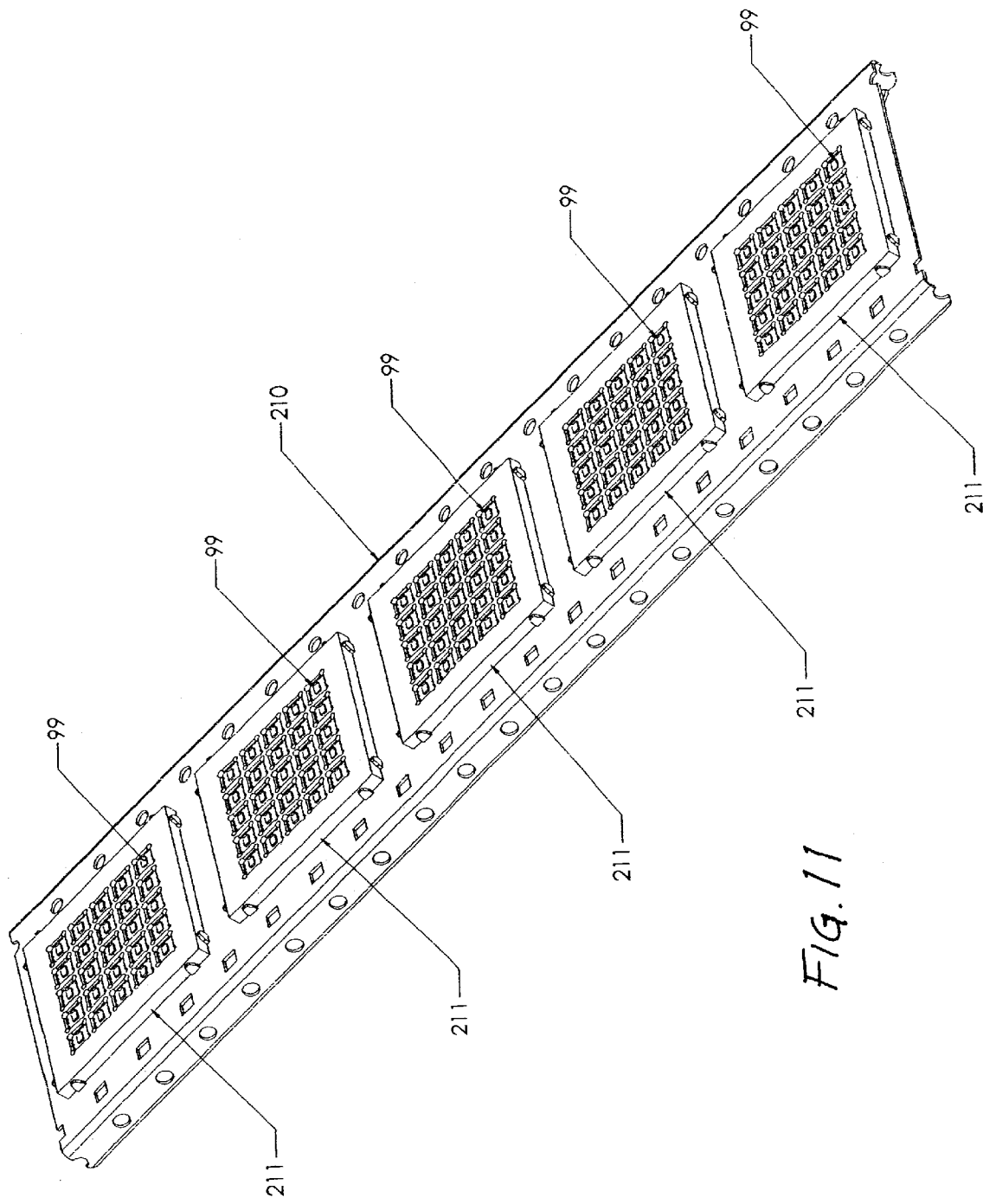
FIG. 11 is a top perspective view of a fully populated boat, i.e. the boat is populated with pallets and each pallet is populated with a full consignment of frequency devices. The fully populated boat is loaded into the magazine (not shown).

FIG. 11 illustrates a boat 210 with five pallets 212. Each of the five pallets 212 is fully loaded with frequency devices 99. Referring once again to FIGS. 2 and 3, one or more boats 210 are positioned laterally in each of the magazines 203. The magazines 203 are loaded onto the magazine rack 200.

One end of the magazine 203 interfaces with the insertion/extraction port 103 (FIG. 2) of the plasma ion chamber 100. An opposite end of the magazine 203 interfaces with a boat pusher assembly 202. With the magazine 203 at the active station, the magazine elevator 201 will precisely align the selected boat 210 with the insertion/extraction port 103 and with the boat pusher assembly 202 by vertically adjusting or moving the magazine 210 so that precise alignment is achieved.

Upon command, the boat pusher assembly 202 will couple to the selected boat 210 and insert the selected boat 210 into the plasma ion chamber 100. Upon completion of the ion trimming process for all the devices contain in the boat 210, the boat pusher assembly 202 will then extract the boat 210 from the plasma ion chamber 100, returning the boat 210 to its assigned location within the magazine 203. The magazine elevator 201 will then align the next selected boat 210 in the magazine 203 with the insertion/extraction port 103 and with the boat pusher assembly 202 by a vertical adjustment of the magazines's position. This alignment and insertion/extraction process is repeated for all boats 210 in the magazine 203 at the active station.

Several of the internal components of the plasma ion chamber 100 are shown in FIG. 3. These components include a baseplate 110 for mounting a plurality of mechanical components, a drive mechanism 120 for transporting the boats to and from the magazines, an ionization station 130, and a shutter mechanism 140. Mounted on the underside of the baseplate 110 are several motor drives, typically stepper motors, for controlling the positioning of the selected boat 210 and the operation of the shutter mechanism 140.

Figure 4:
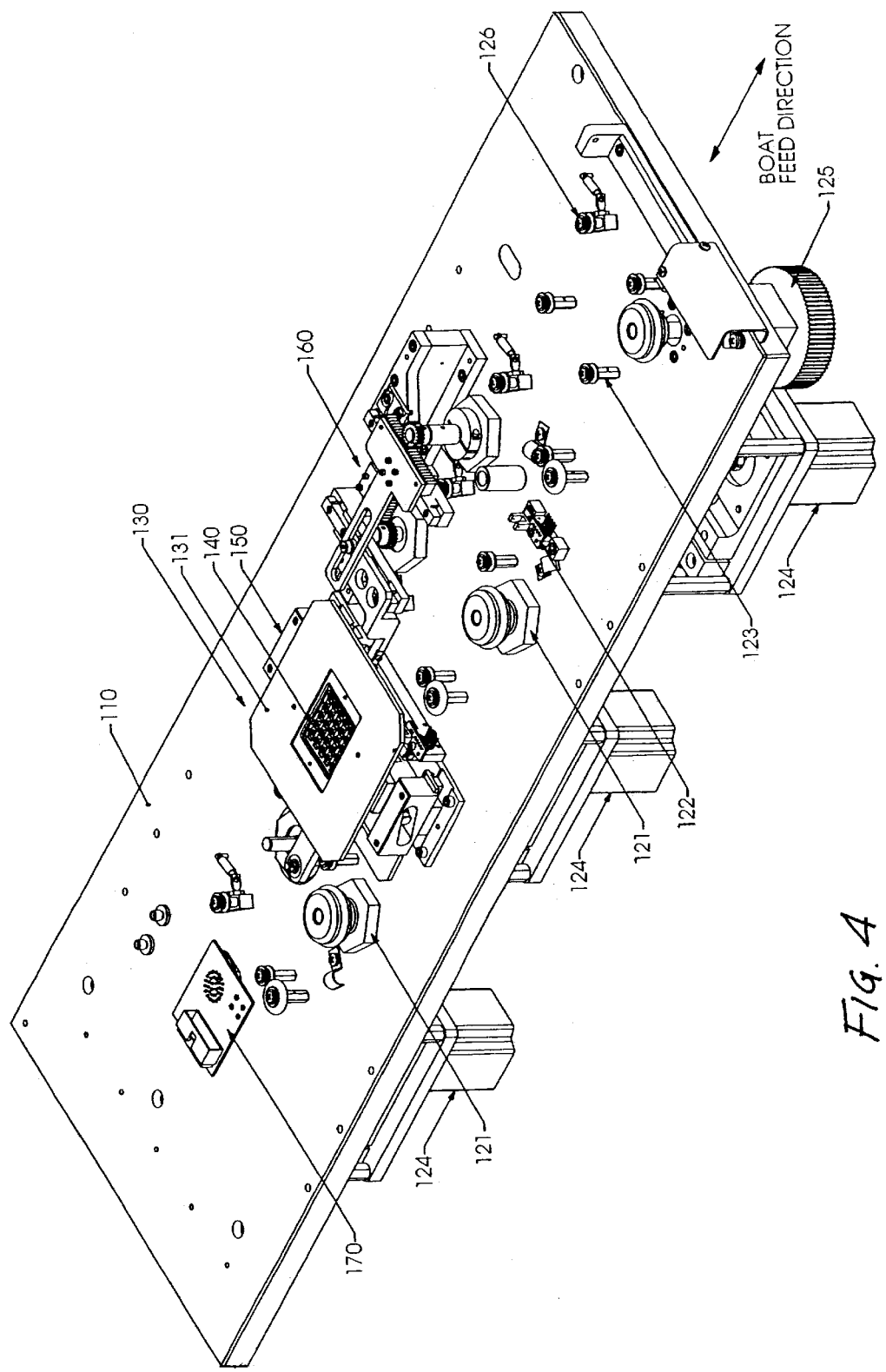
FIG. 4 is a perspective view of certain internal components of the plasma ion chamber including a baseplate for mounting a plurality of mechanical components, a drive mechanism for transporting the boats to and from the magazines, an ionization station and a shutter mechanism.

Referring to FIG. 4, wherein like numerals represent like elements from the preceding figures, many of the internal components of the plasma ion chamber 100 are further illustrated. The base plate 110 is rectangular shape and is horizontally located within the bell jar 101 (FIG. 2).

The drive assembly 120 is coupled to the baseplate 110, and is comprised of a plurality of drive wheels 121, boat positioning sensors 122, fixed vee guide rollers 123, friction drive motors 124, friction drive pulleys 125, and vee tension guide rollers 126. The purpose of the drive assembly 120 is to accurately feed or index the selected boat 210 from the magazine 203 to the ionization station 130 and back to the magazine 203 after frequency trimming of the devices is complete.

Once the boat pusher assembly 202 (FIG. 3) inserts the selected boat 210 into the plasma ion chamber 100, the drive assembly 120 assumes control of the boat 210 and feeds or indexes the selected boat 210 to the ionization station 130, on a pallet by pallet basis. That is, the plasma ionization process which occurs at the ionization station 130 takes place with respect to one pallet at a time and sequentially for each pallet within the selected boat 210. The pallet selected for plasma ion bombardment is maneuvered into the ionization station 130 by the assortment of drive assembly wheels 121, guides 123 and 126, motors 124, and pulleys 125. The selected boat 210 will be laterally positioned by the guide rollers 123 and 126. The system 10 determines boat position within the plasma ion chamber 100 by one or more boat position sensors 122.

Several components of the ionization station 130, which is coupled to the baseplate 110, are shown. These components include the top etching shield 131, which serves to protect against inadvertent etching of the ionization station 130 itself and components adjacent to the ionization station 130 during plasma ion bombardment. The top etching shield 131 is typically fabricated from a low sputter yield material such as graphite or carbon. Also shown in FIG. 4 is a top view of the shutter assembly 140, which is comprised of a plurality of individual shutters, and a partial view of the contact mechanism 150. The shutter assembly 140 and the contact mechanism 150 are both discussed in greater detail below.

Additionally shown in FIG. 4 is the shutter mechanism 160, which is coupled to the base plate 110. The purpose of the shutter mechanism 160 is to effect opening and closing of the individual shutters within the shutter assembly 140. The shutter mechanism 160 is discussed in greater detail below.

The electrical bulkhead 170 is located on the top surface of the baseplate 110. The electrical bulkhead 150 serves as a connector for wiring (not shown) as between the ionization station 130 and the remainder of the system 10, in particular the control console 400 and the frequency evaluator 600.

Figure 5:
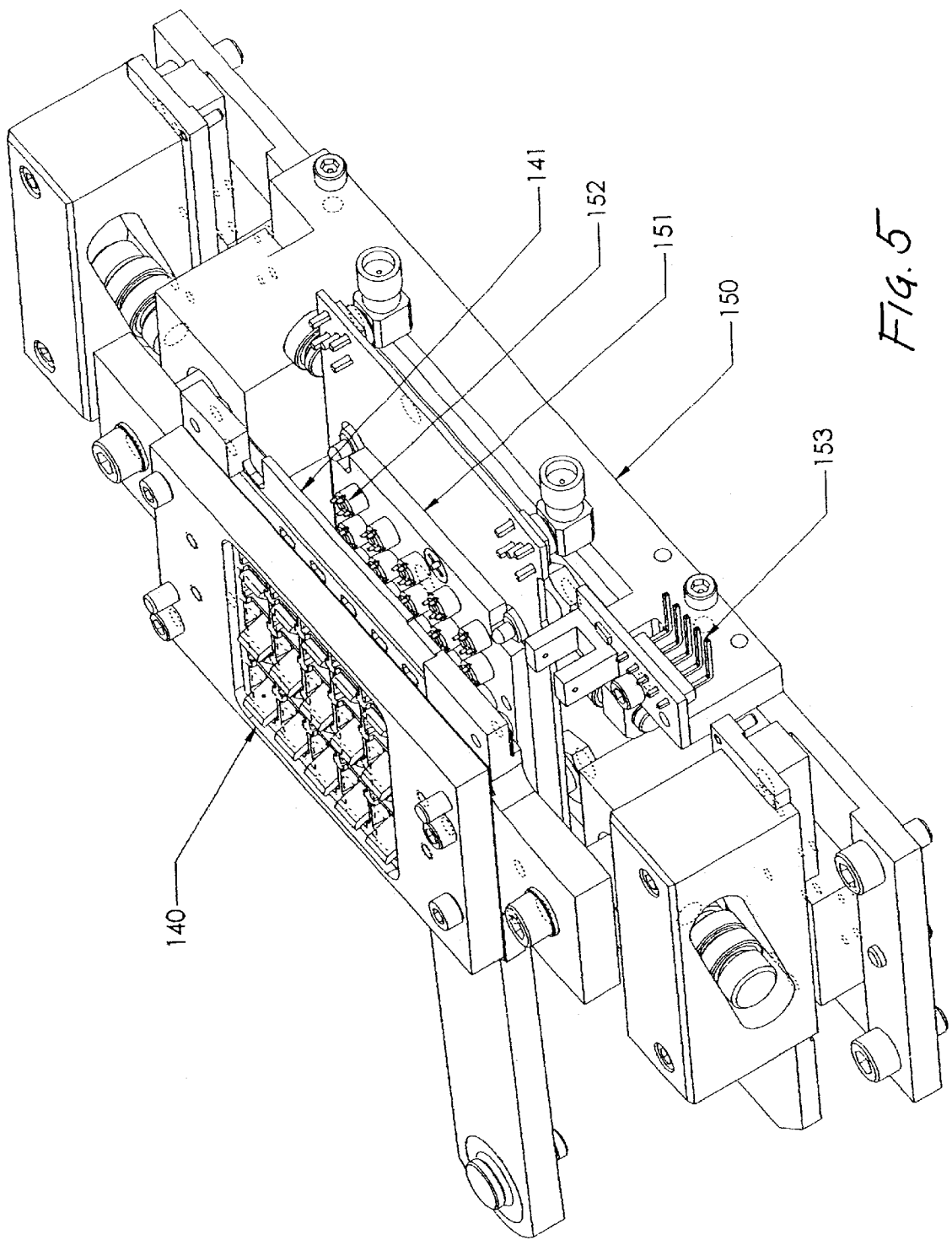
FIG. 5 is a perspective view of the ionization station illustrating the contact mechanism, the shutter assembly, the probe assembly, and the pallet retainer.

Referring to FIG. 5, wherein like numerals represent like elements from the preceding figures, a more detailed view of the shutter assembly 140 and the contact mechanism 150 is shown. The drive assembly 120 (FIG. 3) indexes the selected boat 210 such that one of the pallets is aligned with the pallet retainer 141. The aligned pallet is now in position for plasma ion bombardment.

The shutter assembly 140 comprises a plurality of individually controllable shutters which when in the open position permit passage of the plasma ion beam, thereby resulting in removal of material from the frequency device directly below and aligned with the open shutter. In the closed position, the passage of the plasma ion beam is restricted thereby resulting in no further removal of material from the frequency device directly below and aligned with the closed shutter.

One function of the contact mechanism 150 is to position the probe assembly 151 for contact with the frequency devices on the aligned pallet. The probe assembly 151 is comprised of a plurality of individual probes 152, where each probe 152 corresponds to a frequency device. When the pallet is being aligned with the shutter assembly 140 and the pallet retainer 141 or when ion bombardment is underway, the probe assembly 151 is positioned at the bottom of its travel thereby not contacting the devices. On command from the control console 400, the probe assembly 151 is elevated so that each individual probe 152 makes contact with electrodes on the underside of each of the frequency devices which have been mounted on the aligned pallet. Thus, the probe assembly 151 makes contact with the frequency devices from the underside of the pallet and the ionization process takes place via the shutter assembly 140 from the top side of the pallet.

When a probe 152 makes electrical contact with electrodes on one of the frequency devices, the probe 152 energizes the device to begin producing output data. Once the frequency devices are energized, an accurate measurement of frequency and other desired parameters can be ascertained from the data by the frequency evaluator 600 via the probe assembly 151 and the individual probes 152. This data may be displayed and/or recorded by the control console 400. After all of the frequency devices in the pallet at the ionization station 130 have been trimmed to the proper frequency, the probe assembly 151 is commanded to descend, thereby breaking contact with the frequency devices.

At least one connector 153 serves to electrically connect the contact mechanism 150 with the control console 400 via the electrical bulkhead 170 (FIG. 4). The control console 400, through executing a software program, outputs commands in the form of electrical signals which positions the probe assembly 151 with respect to the frequency devices of the aligned pallet. The probe assembly 151 is electrically connected to the control console 400 and to the frequency evaluator 600 for the purpose of energizing or stimulating the frequency devices and outputing data read by the probes 152. The probe assembly 151, controlling each of the individual probes 152, energizes each of the frequency devices and outputs data to the control console 400 and to the frequency evaluator 600.

Figure 6:
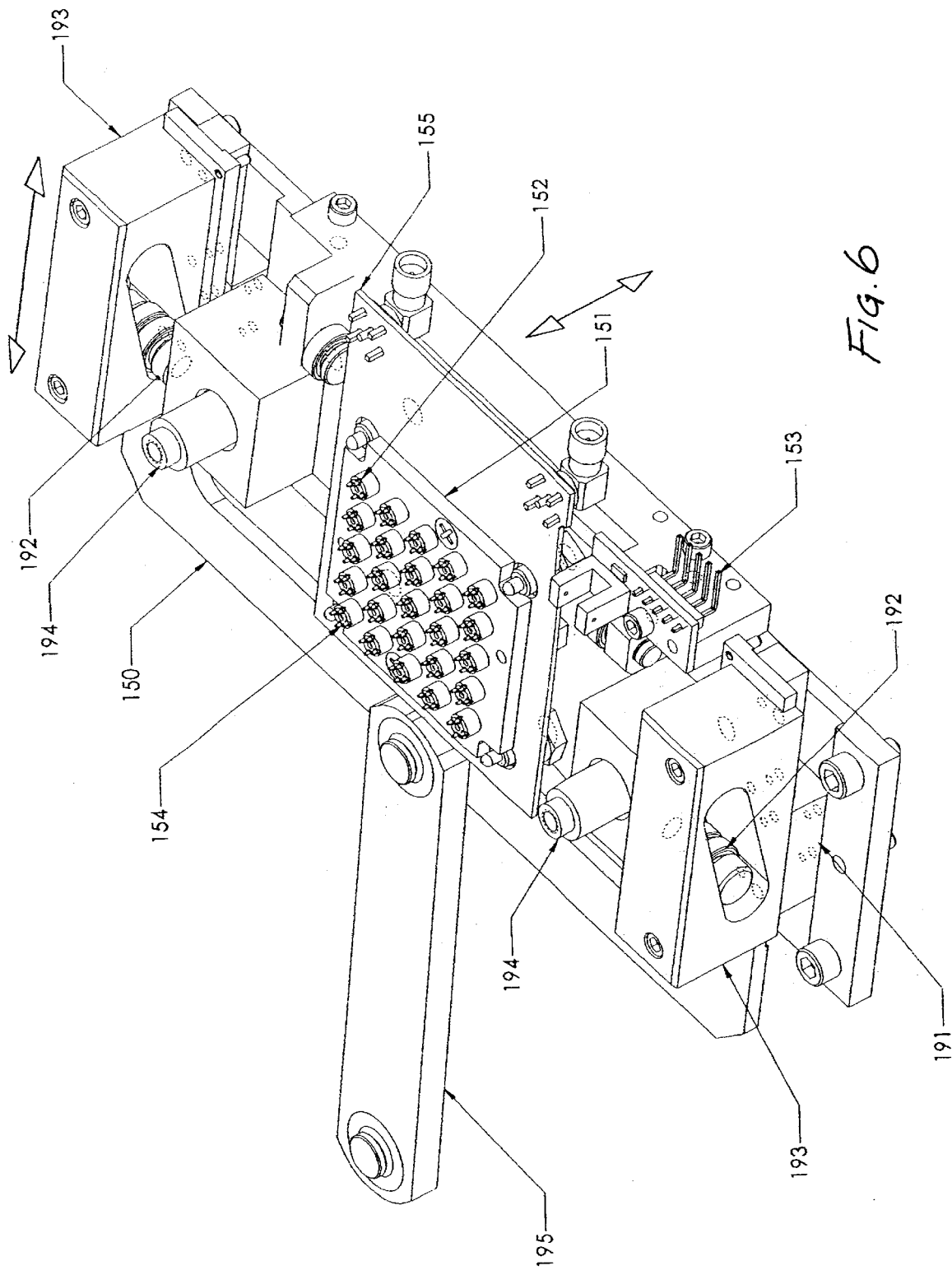
FIG. 6 is a perspective view of a decomposed ionization station without the shutter assembly and the pallet retainer thereby more clearly illustrating the probe assembly.

Referring to FIG. 6, the shutter assembly of FIG. 5 has been removed and the contact mechanism 150 and probe assembly 151 is more clearly illustrated. The probe assembly 151 is comprised of a plurality of individual probes 152 which are laid out in matrix form. Each probe 152 has one or more contacts 154 which may be electrically coupled to the electrode on the counterpart frequency device. The probe assembly 151 is mounted on a printed circuit board 155 (PCB).

The movement of the probe assembly 151 is briefly described. The probe assembly 151 and PCB 155 are coupled to mechanical components which include a linear slide 191, cam followers 192, cam blocks 193, lift shafts 194, a linkage arm 195 and a contact mechanism motor (not shown). Upon command from the control console 400, the contact mechanism motor, which is typically mounted on the underside of the baseplate 110 (FIG. 4) drives the linkage arm 195 in with a rotary motion. The rotary motion causes movement of the linear slide 191 portion of the contact mechanism 150. The cam followers 192 on either side of the contact mechanism 150 begin angled travel within the cam blocks 193. The angled travel of the linear slide 191 causes a vertical travel of the probe assembly 151 and the PCB 155 along the lift shafts 194.

It is the vertical travel along the lift shafts 194 that raises and lowers the probe assembly 151 to make and break contact with the frequency devices. Rotary motion of the linkage arm 195 in one direction causes a corresponding ascending motion of the probe assembly 151 and the PCB 155. Rotary motion in the opposite direction will cause a corresponding descending motion of the probe assembly and PCB 155.

Figure 7:
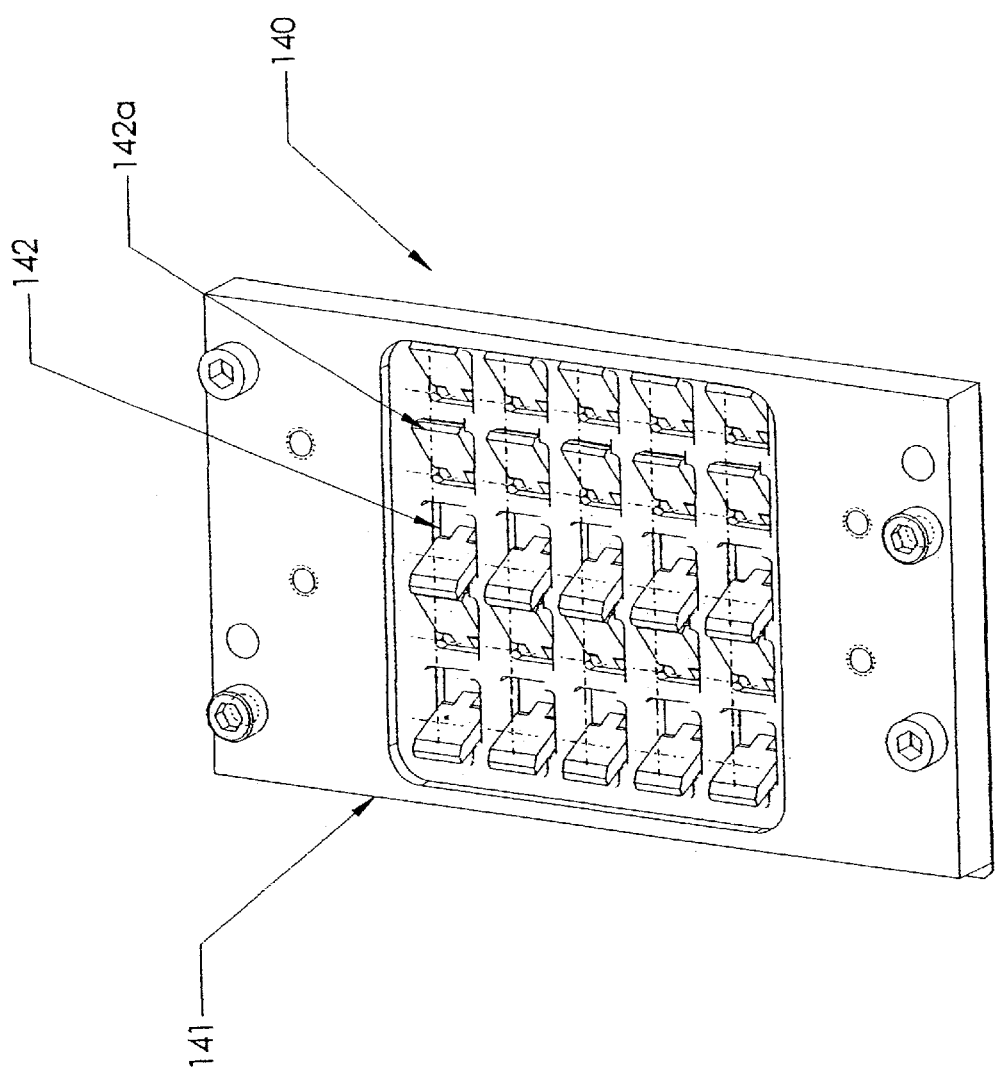
FIG. 7 is a top view of the shutter assembly which illustrates several of the shutters in an open position and several of the shutters in a closed position.

Referring to FIG. 7, a top perspective view of the shutter assembly 140 is shown. The shutter assembly is comprised of a material plate with a plurality of apertures in matrix form and a corresponding plurality of individual shutters 142, each of which shutter 142 resides within an aperture. Each of the shutters 142 may be mechanically opened or closed in a manner as described below. The shutter 142 rotates on an axle or pin (not shown) to achieve either an open or closed position. Shutter 142 illustrates a shutter in an open position. Shutter 142a illustrates a shutter in a closed position.

Note that the shutter assembly 140 (FIG. 5), the pallet and the probe assembly 151 share a common matrix configuration. In the embodiment shown in FIGS. 5 and 6, the matrix is 5 rows and 5 columns for a total of 25 devices. The apparatus can be engineered for a variety of different matrices depending upon process and other parameters. The matrix may be symmetrical as shown, i.e. equal number of rows and columns or asymmetrical, i.e. number of rows different from number of columns. Furthermore, a pallet may be fully or partially loaded with frequency devices thereby permitting increased flexibility of the frequency trimming process.

Figure 8:
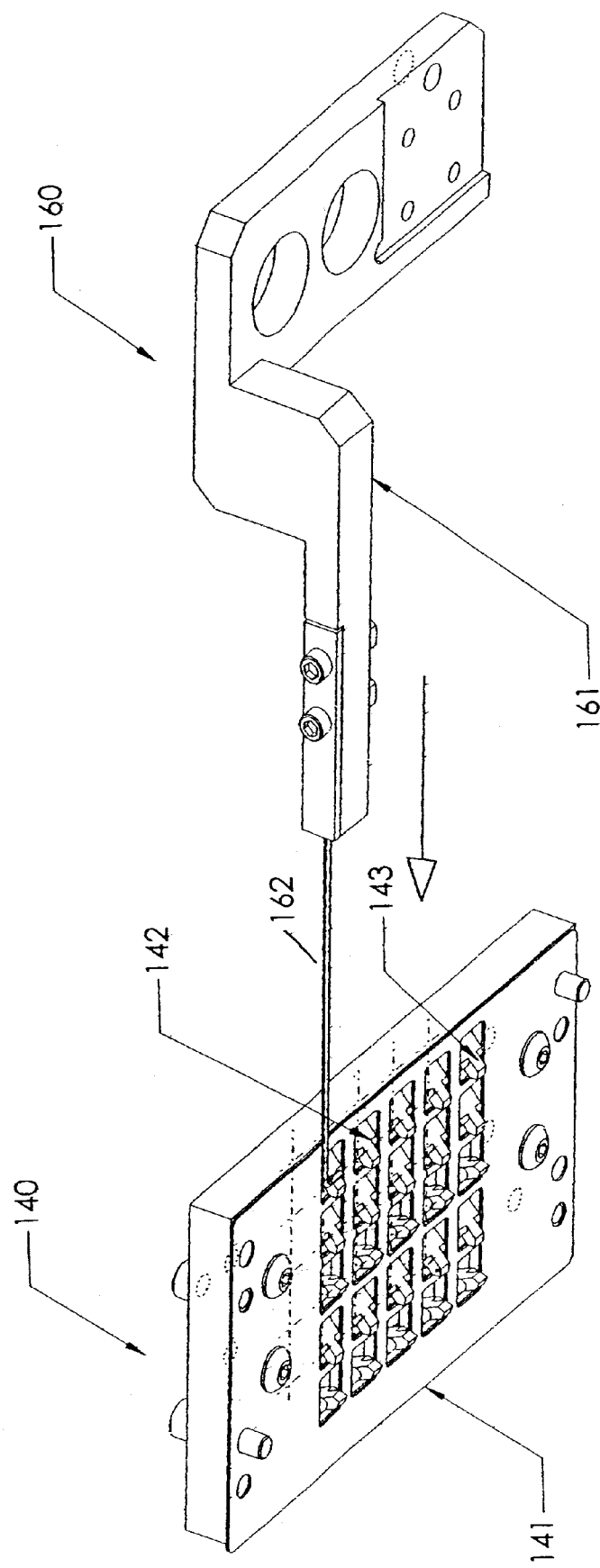
FIG. 8 is a perspective view of the bottom of the shutter assembly and the interface to the shutter mechanism. This figure illustrates the shutter mechanism actuator rod engaging one of the individual shutters at the shutter tab to close the shutter.

Referring to FIG. 8, a view of portions of the shutter mechanism and of the underside of the shutter assembly 140 is shown. The portion of the shutter mechanism shown comprises the actuator rod mount ("mount") 161 and the actuator rod 162 which is mechanically connected to the mount 161. The mount 161 is coupled to the X-Y direction stepper motors (not shown) which control the movement of the mount 161 and thus the actuator rod 162. The X-Y direction stepper motors are connected to and controlled from the control console 400 (FIG. 1).

Each of the shutters 142 has a tab 143. The actuator rod 162 has an angled end 163 which engages the tab 143. Moving the tab 143 in one direction opens the shutter 142 by a partial rotation around the axle. Moving the tab 143 in the opposite direction closes the shutter 142. In the preferred embodiment, moving the tab 143 away from the shutter mechanism 160, also seen as pushing the tab 143, has the effect of closing the shutter 142. Conversely, moving the tab 143 toward the shutter mechanism 160, also seen as pulling the tab 143, will open the shutter 143. The opposite mechanical process, i.e. push to open and pull to close, is readily foreseeable by, for example, rotating the shutter assembly 140.

Referring to FIGS. 1–11, the operation of the system 10 is as follows. The pallets 212, boats 210 and magazines 203 are loaded with frequency devices that require frequency trimming. The magazines 203 are loaded onto the magazine elevator 201. From this point forward the system 10 is under the control of the control console 400 and manual intervention is typically not required until a completed magazine 203 is removed and replaced with a fresh magazine.

The magazine elevator 201 positions one of the magazines 203 at the active station. Fine positioning occurs so that the selected boat 210 is aligned with the boat pusher 202 and with the insertion/extraction port 103 of the plasma ion chamber 100. The boat pusher 202 engages the selected boat 210 and begins pushing the selected boat 210 towards the plasma ion chamber 100.

At the appropriate time, the control console 400 opens the insertion/extraction port 103 and the selected boat 210 enters the bell jar 101. The selected boat 210 engages the drive assembly 120 and the drive assembly 120 takes control of the selected boat 210 from the boat pusher. Once the selected boat is fully within the bell jar 101, the control console 400 closes the insertion/extraction port, thereby sealing the chamber 100.

As the drive assembly 120 positions the first pallet 212 at the ionization station 130, the vacuum evacuator 300 begins creating a vacuum in the bell jar 101. Once the pallet 212 is aligned with the pallet retainer 141 within the ionization station 130, the contact mechanism 150 activates the probe assembly 151 to make contact with the frequency devices 99.

Each of the frequency devices is energized and output data from the frequency devices 99 is sent to the frequency evaluator 600 and control console 400 via the probe assembly 151. The control console 400 will issue the appropriate commands to the shutter mechanism 160 to either open or close the shutters 142 of the shutter assembly 140. After the shutter 142 position is complete, the control console 400 will command that the ion gun 102 be turned on and the ionization process begins.

As the frequency devices 99 are trimmed, the control console 400 will monitor frequency and other parameters and send commands to the shutter mechanism 160 to either open or close individual shutters 142. An open shutter 142 results in ion bombardment for the corresponding frequency device 99 and thus the removal of intrinsic or previously deposited material. A closed shutter 142a prevents the occurrence of ion bombardment to the corresponding frequency device 99. The plasma ion process continues until all frequency devices 99 on a pallet 212 are properly trimmed.

After the ionization process is completed for all the frequency devices 99 on a pallet 212, the drive assembly 120 positions the next pallet 212 in the selected boat 210 at the ionization station 130. This process repeats until all the pallets 212 in the selected boat 210 are completed. Once complete, the vacuum evacuator 300 restores normal atmosphere to the plasma ion chamber 100 and the insertion/extraction port may be opened.

The drive assembly 120 begins ejection of the selected boat 210 from the plasma ion chamber 100. The boat pusher 202 engages the completed boat 210 and extracts it from the plasma ion chamber, thereby returning the boat 210 to its location within the magazine 203. Thus, the bidirectional nature of the drive assembly 120 permits the selected boat 210 to enter and exit the plasma ion chamber 100 from a common port.

Once the completed boat 210 is fully secured in the magazine 203, the magazine elevator 201 indexes the magazine 203 to the next selected boat 210. The ionization process described above is repeated for the next selected boat 210 and for each remaining boat 210 in the magazine 203. After the system 10 has completed trimming of all the frequency devices 99 for the magazine 203 at the active station, the magazine elevator 201 toggles the magazines 203 as between the active and standby stations.

The bombardment or sputtering technique of removing deposited material from the frequency devices 99 is implemented by ionizing argon gas. The detriment of the plasma gas technique in removing deposited material is that it also sputters material from other components in the plasma ion chamber 100. For example, the shutters 142 are made of aluminum, which sputters when bombarded by the argon gas.

This inadvertent, undesirable and unintentional sputtering has negative effects. One effect is a reduction in the longevity of the aluminum shutters 142 and other components exposed to the argon gas. As the aluminum is sputtered off the shutters 142, there is an increasing possibility of mechanical failure of the shutter assembly 140. Also, although much of the sputtered aluminum is removed by the vacuum evacuator 300, there is a possibility that at least some of the vaporized aluminum will migrate to the frequency devices 99 thereby producing anomalies in the process and defects in the frequency devices 99.

To alleviate the problem of aluminum sputtering, oxygen is added to the argon gas. The ionized oxygen reacts with the aluminum to form an aluminum dioxide layer on the surface of aluminum components such as the shutters 142. The aluminum dioxide layer serves to retard the undesirable sputtering of the aluminum components.

Similarly a similar problem exists with undesirable sputtering and migration of carbon based components such as the top etching shield 131. The addition of the oxygen to the argon gas results in ionized oxygen reacting with the sputtered carbon to form carbon dioxide. The carbon dioxide is then removed from the plasma ion chamber 100 by the vacuum evacuator 300. In the absence of the oxygen additive, the carbon would sputter and migrate to the frequency devices 99 and to exposed components in the plasma ion chamber 100 such as the shutters 142, thereby reducing the performance of the system 10.

Although the invention has been particularly shown and described with reference to a preferred embodiment thereof, it will be understood by those skilled in the art that changes in form and detail may be made therein without departing from the spirit and scope of the invention.

What is claimed is:

1. A system for trimming frequency devices, comprising:
    a plasma ion chamber for ion bombardment of the frequency devices, wherein the plasma ion chamber comprises:
        a bell jar for providing a hermetically sealable chamber for conducting plasma ion bombardment;
        a bell jar hinge assembly coupled to the bell jar for opening and closing a surface of the bell jar;
        an insertion/extraction port coupled to the bell jar for inserting and removing the frequency devices from the plasma ion chamber; and
        an ion gun coupled to the bell jar for conducting plasma ionization within the plasma ion chamber;
        a baseplate located internal to the bell jar for mounting a plurality of mechanical components;
        a drive assembly coupled to the baseplate for controlling the movement of a boat containing the frequency devices;
        an ionization station coupled to the baseplate for regulating the plasma ion bombardment of the frequency devices; and
        a shutter mechanism coupled to the baseplate for interfacing with the ionization station;
    a magazine rack coupled to the plasma ion chamber for storing a plurality of the frequency devices;
    a vacuum evacuator coupled to the plasma ion chamber for creating a vacuum in the plasma ion chamber;
    a plasma power supply coupled to the plasma ion chamber for providing power to the ion gun;
    a frequency evaluator coupled to the plasma ion chamber for determining the frequency of the frequency devices; and
    a control console coupled to the plasma ion chamber, the magazine rack, the vacuum evacuator, the plasma power supply and the frequency evaluator for controlling the operation of the system.

2. The system in accordance with claim 1 wherein the ionization station comprises:
    a contact mechanism coupled to the baseplate;
    a shutter assembly coupled to the contact mechanism for regulating the plasma ion bombardment of the frequency devices; and
    a top etching shield coupled to the shutter assembly for protecting at least one of the plurality of mechanical components from plasma ion bombardment.

3. The system in accordance with claim 2 wherein the contact mechanism comprises:
    a probe assembly for acquiring output data from the frequency devices; and
    a linear slide coupled to the probe assembly for controlling the vertical movement of the probe assembly.

4. The system in accordance with claim 3, wherein the probe assembly is comprises:
    a printed circuit board; and
    a plurality of individual probes coupled to the printed circuit board.

5. The system in accordance with claim 3 wherein the probe assembly is elevated to make electrical contact-with the frequency devices.

6. The system in accordance with claim 3 wherein the probe assembly is lowered to terminate electrical contact with the frequency devices.

7. The system in accordance with claim 3 wherein the probe assembly energizes the frequency devices.

8. The system in accordance with claim 7 wherein the probe assembly transmits the output data of the frequency devices to the control console.

9. The system in accordance with claim 7 wherein the probe assembly transmits the output data of the frequency devices to the frequency evaluator.

10. The system in accordance with claim 2 wherein the shutter assembly is comprised of a plurality of individual shutters.

11. The system in accordance with claim 10 wherein each of the plurality of individual shutters has an open position that permits passage of a plasma ion beam and a closed position that restricts passage of the plasma ion beam.

12. The system in accordance with claim 11 wherein the open position and the closed position is independently selected for each of the plurality of individual shutters.

13. The system in accordance with claim 11 wherein each of the individual shutters is coupled to an axle wherein the individual shutter rotates around the axle to either the open position or the closed position.

14. The system in accordance with claim 11 wherein the shutter mechanism is comprised of an actuator rod which engages each of the plurality of individual shutters for placing each of the plurality of individual shutters in either the open position or the closed position.

15. The system in accordance with claim 3 wherein the magazine rack comprises:
    a magazine elevator;
    at least one magazine coupled to the magazine elevator; and
    a boat pusher assembly coupled to the magazine elevator.

16. The system in accordance with claim 15 wherein the magazine elevator comprises an active station and a standby station.

17. The system in accordance with claim 16 wherein the at least one magazine comprises at least one boat.

18. The system in accordance with claim 17 wherein the at least one boat is coupled to at least one pallet.

19. The system in accordance with claim 18 wherein the at least one pallet is coupled to the at least one frequency device.

20. The system in accordance with claim 19 wherein the at least one frequency device is transported from the magazine rack to the plasma ion chamber via an insertion/extraction port and from the plasma ion chamber to the magazine rack via the insertion/extraction port.

* * * * *